United States Patent
Shumaker

(10) Patent No.: US 8,692,586 B2
(45) Date of Patent: Apr. 8, 2014

(54) LOW POWER ISOLATED OUTPUT CIRCUIT

(75) Inventor: Wayne Shumaker, Hopkinton, MA (US)

(73) Assignee: Precision Digital Corporation, Holliston, MA (US)

( * ) Notice: Subject to any disclaimer, the term of this patent is extended or adjusted under 35 U.S.C. 154(b) by 0 days.

(21) Appl. No.: 13/608,270

(22) Filed: Sep. 10, 2012

(65) Prior Publication Data

US 2014/0070871 A1  Mar. 13, 2014

(51) Int. Cl.
*H03B 1/00* (2006.01)
*H03K 3/00* (2006.01)

(52) U.S. Cl.
USPC ........... 327/108; 327/109; 327/110; 327/111; 327/112; 327/291; 327/292; 327/293; 327/294; 327/295; 363/131; 363/132; 363/155; 307/10.1; 307/150

(58) Field of Classification Search
USPC .......................................... 327/108, 291, 295
See application file for complete search history.

(56) References Cited

U.S. PATENT DOCUMENTS

2003/0067281 A1 * 4/2003 Wilk et al. ..................... 320/132
2007/0013356 A1 * 1/2007 Qiu et al. ....................... 323/288

OTHER PUBLICATIONS

Adel Sedra and Kenneth Smith, Microelectronic Circuits, 2004, Oxford Press, Fifth Edition, pp. 237 and 379.*
Texas Instruments, "The ISO72x Family of High-Speed Digital Isolators", Application Report, Jan. 2006.
Vishay Semiconductors, "Faster Switching from Standard Couplers", Application Notes, Feb. 11, 2008.
Linear Technology, "Self-Powered Isolated Comparator", LTC 1531, 1998.

* cited by examiner

*Primary Examiner* — John Poos
(74) *Attorney, Agent, or Firm* — Preti Flaherty Beliveau & Pachios LLP

(57) ABSTRACT

An output circuit providing isolation between inputs and the output employs first and second opto-couplers for isolation. Pulse activation of the first opto-coupler turns on an output transistor and pulse activation of the second opto-coupler turns off the output transistor. An input stage of the output circuit is and light emitting devices of the first and second opto-couplers are powered by a first power source and an output stage of the output circuit is powered from an external power source. Power consumption by the input stage of output circuit occurs only during pulse activation of the first and second opto-couplers.

19 Claims, 2 Drawing Sheets

LOW POWER ISOLATED OUTPUT CIRCUIT

STATEMENT REGARDING FEDERALLY SPONSORED RESEARCH OR DEVELOPMENT

Not Applicable

BACKGROUND OF THE INVENTION

The present invention relates to an isolated output circuit that is suitable for low power applications.

Process control devices, such as rate/totalizer meters, frequently provide an isolated output that provides an indication that a certain count has been reached or an isolated output indicative of an alarm condition. A common circuit that is used to achieve an isolated pulse output employs an optical-coupler with an open collector interface. When the output is active, the open collector is pulled low for the period in which the output is on. As a result the open collector output draws current during the entire period that the open collector output is in the on state. Output circuits of this configuration are thus not well suited for battery powered applications.

It would therefore be desirable to have an isolated output circuit that is particularly suited for battery or other applications requiring low power consumption.

BRIEF SUMMARY OF THE INVENTION

In accordance with the present invention, an output circuit 100 is disclosed that provides isolation between the inputs and outputs and is particularly suited for use in low power applications, such as battery powered applications. An output transistor, such as an FET, is turned on and off using a dynamic pulsed method which consumes very low current from the power source for the output circuit. Inputs to the circuit are isolated from the output FET through the use of two opto-couplers. By turning the output FET on and off via the use of the two opto-couplers, the circuit draws current from a first power source, such as a battery, only for the duration of the pulsed inputs to the output circuit. The current drawn from the first power source is thus not dependent upon the on-time of the output transistor.

Other features, aspects and advantages of the presently disclosed output circuit will be apparent to those of ordinary skill in the art in view of the drawings and detailed description of the invention that follow.

BRIEF DESCRIPTION OF THE SEVERAL VIEWS OF THE DRAWINGS

The invention will be more fully understood by reference to the Detailed Description of the Invention in conjunction with the drawings of which.

DETAILED DESCRIPTION OF THE INVENTION

Figure 1:
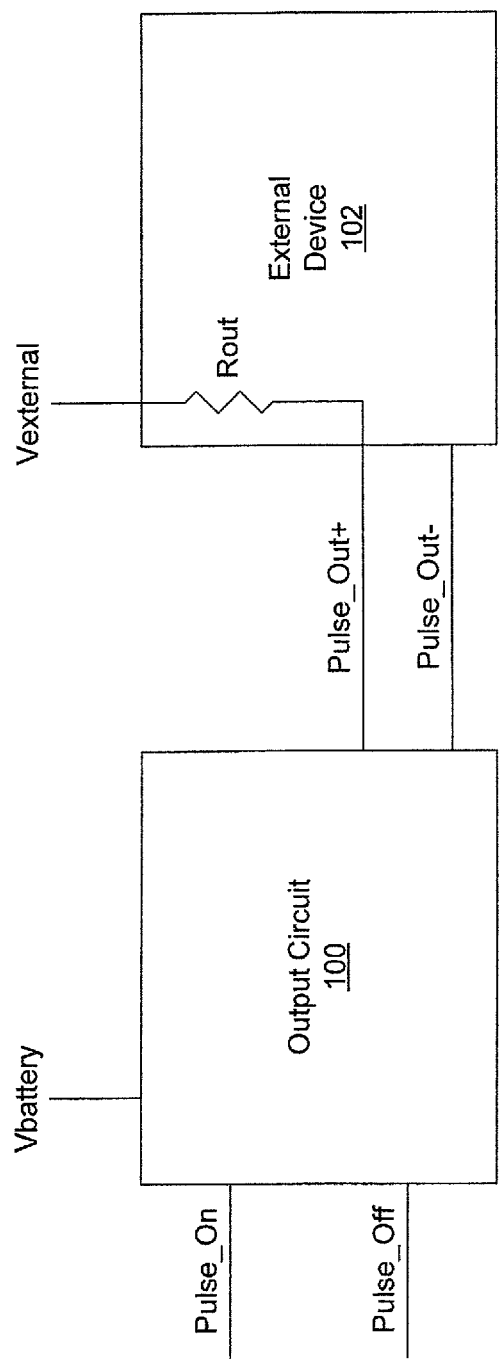
FIG. 1 is a block diagram depicting an output circuit operative in accordance with the present invention.
Figure 2:
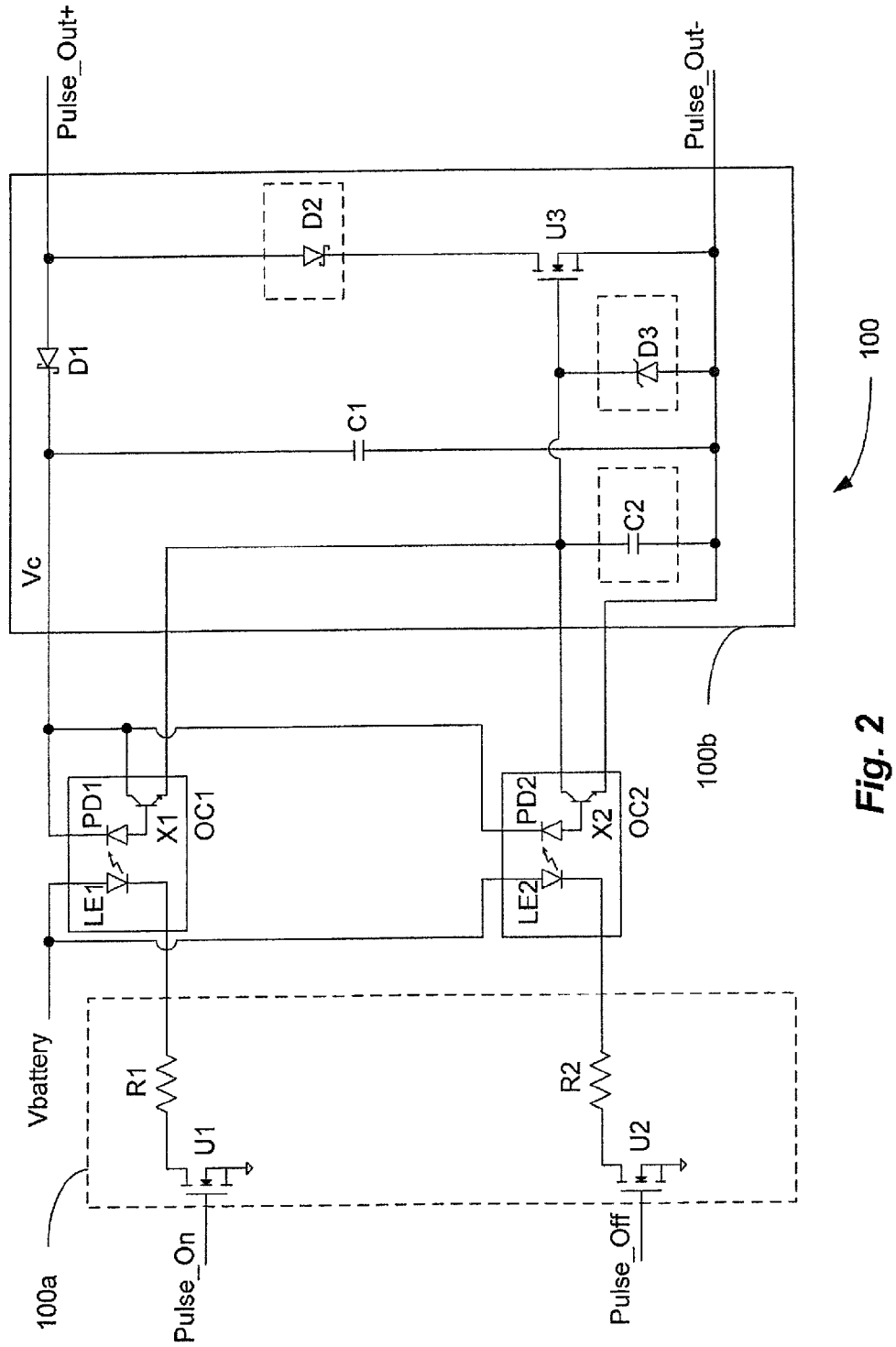
FIG. 2. is circuit diagram of one embodiment of the output circuit of FIG. 1.

In accordance with the present invention, a low-power isolated output circuit is disclosed that is particularly suited for low power applications such as battery powered applications. Referring to FIGS. 1 and 2, two opto-couplers OC1, OC2 are employed to isolate the inputs Pulse_On and Pulse Off of the output circuit 100 from the output signals Pulse_Out+, Pulse_Out-. The output circuit 100 includes an input stage 100a and an output stage 100b with the two opto-couplers OC1, OC2 disposed therebetween and providing optical isolation. Power for the input stage 100a and light emitting diodes LE1, LE2 of the opto-couplers OC1, OC2 are provided by a first power source that is coupled to Vbattery. Power for the output stage 100b is provided by an external power source Vexternal, that is typically associated with an external device 102 that receives the output circuit 100 output signal.

Inputs to the output circuit are pulsed and power is drawn from the output circuit power source for only the brief period for which the pulses are active. The pulses are operative to turn an output FET on and off. The FET is operated as an open collector device and is coupled to the power source for the device to which the presently disclosed output circuit is coupled. Thus, the power provided when the open collector output FET is in the On state, is not supplied by the power source for the output circuit per se.

Referring to FIG. 1, the output circuit 100 receives inputs Pulse_On and Pulse_Off and produces a optically isolated output signal Pulse_Out+, Pulse_Out- which is coupled to an external device 102. The presently disclosed output circuit 100 is powered by a battery (not shown) having a voltage Vbattery as illustrated in FIG. 1. The Vbattery voltage may alternatively be supplied by a line powered power supply.

The output circuit 100 includes an output transistor or FET (as subsequently described) that, in the exemplary embodiment, is operated in an open collector or open drain configuration, as applicable, and coupled to an external power source Vexternal through a resistor Rout.

Referring to FIG. 2, the output circuit 100 includes an input stage 100a, an output stage 100b and a pair of opto-couplers OC1, OC2 that couple the input and output stages while providing optical isolation therebetween.

More specifically, the input signal Pulse_On is coupled to the gate of FET U1. The drain of the FET U1 is coupled to the light emitting diode (LED) LE1 of the opto-coupler OC1 through a series resistor R1. The anode of the light emitting diode is coupled to a first power source Vbattery that powers only the LEDs LE1, LE2 and the input stage 100a of the output circuit 100. Upon pulsing of the input signal Pulse_On, the LED LE1 emits light which causes photodiode PD1 within the opto-coupler OC1 to inject current in the base of the transistor X1 to thereby turn on the transistor X1 which serves as a switch.

Similarly, the input signal Pulse_Off is coupled to the gate of FET U2. The drain of FET U2 is coupled to the light emitting diode (LED) LE2 of the opto-coupler OC2 through a series resistor R2. Upon pulsing of the input signal Pulse_On, the LED LE1 emits light which causes photodiode PD2 within the opto-coupler OC2 to inject current in the base of the transistor X2 to thereby turn on the transistor X2 which serves as a switch.

The output stage 100b includes an output transistor which, in the present case, is illustrated as an FET U3. The FET U3 is turned on in response to pulsing of the input signal Pulse_on and is turned off in response to pulsing of the input signal Pulse_Off.

A Second power source for an external device 102 provides current that is employed to charge capacitor C1 within the output stage 100b through diode D1. The FET U3 provides open collector/drain drive for the Pulse_Out+ output signal. Optional schottky barrier D2, when employed, provides reverse voltage protection for the drain of output FET U3.

The inherent gate to source capacitance of the output FET U3 provides charge storage and if the gate to source capacitance is charged, the output FET U3 is biased to the ON state. If the gate to source capacitance is discharged, the output FET U3 is biased to the OFF state.

If the gate to source capacitance associated with the output FET U3 is insufficient to maintain a charge for a sufficient period of time in a given application, optional capacitor C2 is employed to provide the desired capacitance.

To turn on the output FET U3, the input FET U1 is pulsed via the Pulse_On signal. Pulsing of the gate of input FET U1 activates the LED LE1 within opto-coupler OC1. Activation of the LED LE1 results in the photodiode PD1 within the opto-coupler OC1 injecting current into the base of the output transistor X1 of the opto-coupler OC1 which turns on the transistor X1. When the transistor X1 within the opto-coupler turns on, the gate to source capacitance of the output FET U3 is charged to a voltage up to Vc and sufficient to turn on FET U3. If the capacitor C2 is employed, pulsing of the input to the FET U1 results in the charging of the capacitor C2 to Vc since the capacitor C2 is in parallel with the gate to source capacitance of the output FET U3. When the gate of the output FET U3 is charged to greater that the FET threshold turn on voltage, the output FET U3 turns on and pulls the output Pulse_Out+ low. Due to the high impedance of the output FET U3 gate input, the FET U3 will remain on for a period of time depending on the impedance characteristics of the FET U3 and/or the capacitor C2 if used. In the absence of pulsing of the inputs Pulse_On or Pulse_Off, no current is drawn from the first power source connected to Vbattery.

To turn off the output FET U3, Pulse_Off is pulsed to turn on input FET U2 which, in turn, activates the LED LE2 within the opto-coupler OC2. As discussed in connection with OC1, activation of the LED LE2 in the opto-coupler OC2 causes the photodiode PD2 to inject current into the base of the transistor X2. The transistor X2 of the opto-coupler OC2 is coupled across the base to source junction of the output FET U3 and discharges the base to source capacitance upon pulsing of the input signal Pulse_Off. Additionally, if C2 is employed, pulsing of the input signal discharges C2. When the gate to source capacitance (and C2 if present) is discharged below the FET threshold turn on voltage, the output FET U3 turns off and the output Pulse_Out+ is pulled high via pull-up resister Rout (FIG. 1) which is coupled to the external power source Vexternal.

Thus, power is supplied by Vbattery only during the brief periods when Pulse_On or Pulse_Off are pulsed to turn the Output FET U3 on or off respectively unlike typical output circuits which draw power continuously from the output circuit power source.

While the output FET U3 is in the OFF state, the external power source Vexternal recharges C1. During long periods in which the output FET U3 is in the ON state, C1 can discharge. To maintain the output FET U3 in the ON state, additional gate charge current is provided by periodically pulsing Pulse_On. Pulsing Pulse_On results in the injection of small amounts of current from the photodiode PD1 through the base emitter junction of transistor X1 which maintains the charge of the gate to source capacitance (and C2 if present) in order to maintain the output FET U3 in the ON state.

Optional zener or avalanche diode D3 provides overvoltage protection for the gate of the output FET U3. Diode D1 prevents the discharge of capacitor C1 when the output FET U3 is in the ON state.

The above-described output circuit provides advantages over conventional isolation output circuits. The current requirements from the first power source coupled to Vbattery are minimized by only requiring short duration pulses to turn the open-collector/drain output FET on or off. Power consumed from Vbattery is proportional to the pulse output frequency, and thus the power drawn the first power source is independent of the state of the output FET U3. By way of example, when the present output circuit is employed to provide an output alarm indication, the opto-couplers do not continuously draw current from the Vbattery power source even if the alarm signal remains in the ON state.

Furthermore, use of an output FET provides a lower drain-source voltage when the output FET is in the ON state that is achieved using a darlington transistor configuration, which requires an extra output voltage drop to drive the Darlington transistor.

Additionally, the presently disclosed output circuit does not require high Current Transfer Ratio (CTR) opto-couplers. Lower CTR opto-couplers tend to be faster than high CTR opto-couplers and can achieve higher output frequencies than traditional low power opto-coupler approaches.

It will be appreciated by those of ordinary skill in the art that modifications to and variations of the above-described invention may be made without departing from the inventive concepts and methods disclosed herein. Accordingly, the invention is not to be viewed as limited except by the scope and spirit of the appended claims.

What is claimed is:

1. An output circuit for generating an optically isolated output signal for an external device having an external power source, the output circuit comprising:
   a first opto-coupler including a first light emitting device coupleable to a first power source, the first opto-coupler including a first input and a first transistor switch optically isolated from the first input;
   a second opto-coupler including a second light emitting device coupleable to the first power source, the second opto-coupler including a second input and a second transistor switch optically isolated from the second input;
   a first charge storage device providing a first capacitance, the first charge storage device being chargeable in response to activation of the first transistor switch and dischargeable in response to activation of the second transistor switch;
   a second charge storage device that is coupleable to and chargeable from the external power source; and
   an output transistor disposed between a first output rail and a second output rail of the external power source and coupled to the first charge storage device;
   wherein the output circuit is configured and operative upon pulse activation of the first input by a first pulse to turn on the first transistor switch to charge the first charge storage device and to cause the output transistor to assume a first output state and wherein the output circuit is configured and operative upon pulse activation of the second input to turn on the second transistor switch to discharge the first charge storage device and to cause the output transistor to assume a second output state distinct from the first output state, and
   wherein the first charge storage device is chargeable from the second charge storage device in response to pulse activation of the first input.

2. The output circuit of claim 1 wherein the output transistor is a field effect transistor (FET).

3. The output circuit of claim 2 wherein the output FET is configured in an open drain arrangement.

4. The output circuit of claim 2 wherein the output FET includes a gate, a source and a drain and the first charge storage device comprises inherent gate to source capacitance of the output FET.

5. The output circuit of claim 2 wherein the first charge storage device comprises a discrete capacitor coupled between the gate and the source of the output FET.

6. The output circuit of claim 1 wherein the opto-coupler includes a first photodiode coupled to the base of the first transistor switch and upon depletion of the charge on the second charge storage device during a prolonged period in which the output transistor is in the first output state and, in response to pulse activation of the first input, the first photodiode is operative to inject a current pulse into the base of the first transistor switch to charge the first charge storage device through the base-emitter junction of the first transistor switch and thereby maintain the output transistor in the first output state.

7. The output circuit of claim 1 wherein the output transistor is conducting in the first output state and non-conducting in the second output state.

8. A method of generating an optically isolated output signal for use by an external device that is powered by an external power source, the method comprising:
pulse activating a first light emitting device within a first opto-coupler, the first light emitting device coupled to a first power source distinct from the external power source, the first light emitting device consuming power from the first power source only upon the pulse activation thereof;
responsive to the pulse activation of the first light emitting device within the first opto-coupler, turning on a first transistor switch within the first opto-coupler, the first transistor switch coupled to a power source distinct from the first power source and operative to charge a first charge storage device to a first threshold voltage associated with an output transistor sufficient to cause the output transistor coupled to the first charge storage device to assume a first output state;
pulse activating a second light emitting device within a second opto-coupler, the second light emitting device coupled to the first power source, the second light emitting device consuming power from the first power source only upon the pulse activation thereof;
responsive to the pulse activation of the second light emitting device, turning on a second transistor switch within the second opto-coupler to discharge the first charge storage device to a second threshold voltage sufficient to cause the output transistor coupled to the first charge storage device to assume a second output state distinct from the first output state; and
charging a second charge storage device from the external power source and charging the first charge storage device at least in part from the second charge storage device in response to the pulse activation of the first light emitting device.

9. The method of claim 8 wherein charging the first charge storage device from a power source distinct from the first power source includes charging the first charge storage device from the external power source.

10. The method of claim 8 wherein charging the first charge storage device from a power source distinct from the first power source includes charging the first charge storage device from a second charge storage device.

11. The method of claim 8 wherein the output transistor comprises an output field effect transistor (FET) having a gate in communication with the first charge storage device, and wherein the output FET is configured in an open drain arrangement between positive and negative voltage rails of the external power source.

12. The method of claim 11 further including coupling a resistor between the positive voltage rail and the drain of the output FET.

13. The method of claim 11 wherein the first charge storage device comprises a gate to source structure within the output FET providing a gate to source capacitance of the output FET.

14. The method of claim 11 wherein the first charge storage device comprises a first capacitor coupled between the gate and source of the output FET.

15. The method of claim 8 further including periodically pulse activating the first light emitting device to repeatedly charge the first charge storage device to the first threshold voltage to maintain the output transistor in the first output state.

16. The method of claim 8 further including periodically pulse activating the second light emitting device to repeatedly discharge the first charge storage device to a voltage below the second threshold voltage to maintain the output transistor in the second output state.

17. The method of claim 8 further including drawing power for the output circuit from the first power source only during the pulse activation of the first and second light emitting devices.

18. The method of claim 8 wherein the first transistor switch includes a base, an emitter and an collector, the method further including at a time when a second charge storage device is at depleted, pulse activating the first light emitting device to cause a photodiode within the first opto-coupler to inject a current into the base of the transistor switch so as to charge the first charge storage device through the base emitter junction of the first transistor switch.

19. The method of claim 8 wherein pulse activating the first light emitting device includes pulse activating a first light emitting diode and pulse activating the second light emitting device includes pulse activating a second light emitting diode.

* * * * *